US011835816B2

(12) United States Patent
Lee et al.

(10) Patent No.: US 11,835,816 B2
(45) Date of Patent: Dec. 5, 2023

(54) CIRCUIT BOARD FOR LIGHT-EMITTING DIODE ASSEMBLY, BACKLIGHT UNIT INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Cheol Hun Lee, Gyeonggi-do (KR); Do Hyoung Kwon, Gyeonggi-do (KR); Sung Jin Noh, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 17/883,753

(22) Filed: Aug. 9, 2022

(65) Prior Publication Data

US 2023/0044317 A1 Feb. 9, 2023

(30) Foreign Application Priority Data

Aug. 9, 2021 (KR) .................. 10-2021-0104331

(51) Int. Cl.
*G02F 1/13357* (2006.01)
*G02F 1/1335* (2006.01)

(52) U.S. Cl.
CPC .. *G02F 1/133603* (2013.01); *G02F 1/133612* (2021.01)

(58) Field of Classification Search
CPC ........ G02F 1/133603; G02F 1/133612; H05K 1/111; H05K 1/181
See application file for complete search history.

(56) References Cited

U.S. PATENT DOCUMENTS

| 2018/0180249 A1* | 6/2018 | Yamada | ................. H01L 33/505 |
| 2022/0262995 A1* | 8/2022 | Li | ......................... H01L 25/167 |
| 2022/0351694 A1* | 11/2022 | Kim | ..................... G09G 3/3611 |
| 2023/0037537 A1* | 2/2023 | Lee | ................... G02F 1/133612 |
| 2023/0038765 A1* | 2/2023 | Lee | ................... G02F 1/133603 |

FOREIGN PATENT DOCUMENTS

| KR | 10-1303188 B1 | 9/2013 | |
| KR | 10-2021-0008246 A | 1/2021 | |
| WO | WO-2022205528 A1 * | 10/2022 | ........... G02F 1/1334 |

* cited by examiner

*Primary Examiner* — Tracie Y Green
(74) *Attorney, Agent, or Firm* — The PL Law Group, PLLC

(57) ABSTRACT

A circuit board for a light-emitting diode assembly includes a substrate layer, a dimming zone column disposed on one surface of the substrate layer, the dimming zone column including dimming zones, each of the dimming zones including a predetermined number of LED landing pads. The dimming zones includes a predetermined number of first dimming zones and a predetermined number of second dimming zones, a first common wiring commonly connected to the first dimming zones and disposed at a first lateral side in a row direction of the dimming zone column, a second common wiring connected to the second dimming zones and disposed at a second lateral side in the row direction opposite to the first lateral side of the dimming zone column, and an individual wiring connected to each of the dimming zones.

18 Claims, 8 Drawing Sheets

CIRCUIT BOARD FOR LIGHT-EMITTING DIODE ASSEMBLY, BACKLIGHT UNIT INCLUDING THE SAME AND IMAGE DISPLAY DEVICE INCLUDING THE SAME

CROSS-REFERENCE TO RELATED APPLICATION AND CLAIM OF PRIORITY

This application claims the benefit under 35 USC § 119 of Korean Patent Application No. 10-2021-0104331 filed on Aug. 9, 2021 in the Korean Intellectual Property Office (KIPO), the entire disclosure of which is incorporated herein by reference for all purposes.

BACKGROUND

1. Field

The present invention relates to a circuit board for a light-emitting diode assembly, a backlight unit including the same and an image display device including the same. More particularly, the present invention relates to a circuit board for a light-emitting diode assembly including a substrate and a circuit wiring, a backlight unit including the same, and an image display device including the same.

2. Description of the Related Art

A cold cathode fluorescent lamp (CCFL) has been conventionally used as a backlight source of a liquid crystal display (LCD) device. However, the CCFL uses a mercury gas, and thus may cause environmental pollution and may be disadvantageous from aspects of a response speed and a color reproducibility. Further, the CCFL was disadvantageous in a fabrication of a thin LCD panel.

Accordingly, a light-emitting diode (LED) is being employed as the backlight source. The LED is an eco-friendly light source, and may provide a high-speed response and a color reproducibility with high-luminance. Additionally, luminance, color temperature, etc., may be adjusted by controlling a light-amount of red, green and blue LEDs, and the thin LCD panel with a compact size may be fabricated using the LED.

The LED light source may be mounted on a circuit board to define a backlight unit, and the backlight unit may be disposed under the LCD panel.

Landing pads on which a plurality of the LEDs are each mounted may be disposed on the circuit board, and wirings for a power supply to the landing pads and an operational control may be arranged.

As the large number of the landing pads are included in one circuit board, a uniform channel resistance may not be provided for each LED and an efficient circuit design may not be obtained due to a large circuit density. Further, as disclosed in Korean Registered Patent Publication No. 10-1303188, when wirings are disposed on both surfaces of a circuit board, additional via holes or contacts are required to cause a degradation of an electrical circuit connection reliability.

SUMMARY

According to an aspect of the present invention, there is provided a circuit board for a light-emitting diode assembly providing improved electrical property and luminant efficiency.

According to an aspect of the present invention, there is provided a circuit board module for a light-emitting diode assembly providing improved electrical property and luminant efficiency.

According to an aspect of the present invention, there is provided a backlight unit providing improved electrical property and luminant efficiency.

According to an aspect of the present invention, there is provided an image display device including the backlight unit.

(1) A circuit board for a light-emitting diode assembly, including: a substrate layer; a dimming zone column disposed on one surface of the substrate layer, the dimming zone column comprising dimming zones, each of the dimming zones including a predetermined number of LED landing pads, wherein the dimming zones include a predetermined number of first dimming zones included in an upper portion of the dimming zone column in a plan view and a predetermined number of second dimming zones included in a lower portion of the dimming zone column in the plan view; a first common wiring commonly connected to the first dimming zones and disposed at a first lateral side in a row direction of the dimming zone column; a second common wiring connected to the second dimming zones and disposed at a second lateral side in the row direction opposite to the first lateral side of the dimming zone column; and an individual wiring connected to each of the dimming zones.

(2) The circuit board for a light-emitting diode assembly of the above (1), wherein the individual wiring includes first individual wirings disposed at the second lateral side of the dimming zone column; and second individual wirings disposed at the first lateral side of the dimming zone column.

(3) The circuit board for a light-emitting diode assembly of the above (2), wherein the first individual wirings are each connected to the first dimming zones, and the second individual wirings are each connected to the second dimming zones.

(4) The circuit board for a light-emitting diode assembly of the above (2), wherein the number of the first dimming zones and the number of the second dimming zones are the same, or a difference between the number of the first dimming zones and the number of the second dimming zones is 1.

(5) The circuit board for a light-emitting diode assembly of the above (4), wherein the number of the second individual wirings disposed at the first lateral side and the number of the first individual wirings disposed at the second lateral side are the same, or a difference between the number of the second individual wirings disposed at the first lateral side and the number of the first individual wirings disposed at the second lateral side is 1.

(6) The circuit board for a light-emitting diode assembly of the above (1), wherein the LED landing pads, the first common wiring, the second common wiring and the individual wiring are all disposed in a single-layered conductive layer.

(7) The circuit board for a light-emitting diode assembly of the above (6), further including connection pads formed at each terminal end portion of the first common wiring, the second common wiring and the individual wiring.

(8) The circuit board for a light-emitting diode assembly of the above (1), further including an insulating layer formed on the substrate layer to cover the first common wiring, the second common wiring and the individual wiring, the insulating layer including an opening partially exposing each of the LED landing pads.

(9) The circuit board for a light-emitting diode assembly of the above (8), wherein a double-layered structure consisting of a single-layered conductive circuit layer including the LED landing pads, the first common wiring, the second common wiring and the individual wiring, and a single-layered insulating layer is stacked on the one surface of the substrate layer.

(10) The circuit board for a light-emitting diode assembly of the above (9), further including an intermediate layer formed between the conductive circuit layer and the substrate layer.

(11) The circuit board for a light-emitting diode assembly of the above (10), wherein the intermediate layer includes a plating seed layer or an adhesive layer.

(12) The circuit board for a light-emitting diode assembly of the above (1), wherein each of the LED landing pads includes a first landing pad and a second landing pad which are physically separated from each other and have different polarities

(13) The circuit board for a light-emitting diode assembly of the above (12), wherein each of the dimming zones further includes a connection wiring connecting the first landing pad and the second landing pad included in different neighboring LED landing pads to each other.

(14) The circuit board for a light-emitting diode assembly of the above (1), wherein a plurality of the dimming zone columns are repeatedly arranged along a row direction.

(15) The circuit board for a light-emitting diode assembly of the above (1), wherein the substrate layer includes a glass substrate, an organic polymer substrate or an inorganic insulating substrate.

(16) A circuit board module for a light-emitting diode assembly comprising the circuit board for a light-emitting diode assembly according to embodiments as described above, wherein a plurality of the circuit boards for a light-emitting diode assembly are repeatedly arranged in a tile type along a row direction and a column direction.

(17) A backlight unit, including: the circuit board for a light-emitting diode assembly according to embodiments as described above; and light emitting diodes mounted on the circuit board for a light-emitting diode assembly.

(18) An image display device, including: the backlight unit according to embodiments as described above; and a liquid crystal panel disposed on the backlight unit.

According to exemplary embodiments, a common wiring and individual wirings may be disposed together at both lateral portions of a dimming zone column. Accordingly, a periodicity of an LED array may be achieved, and a dead zone in an array substrate may be reduced. Therefore, an efficiency of LED mounting, a degree of integration and a light-emitting property may be improved, and a spatial efficiency may be improved.

In exemplary embodiments, upper and lower portions of the dimming zone column may be separated, and the common wiring connected to the upper portion and the common wiring connected to the lower portion may each be disposed at both lateral portions of the dimming zone column. Further, the individual wirings connected to the upper portion and the individual wirings connected to the lower portion may each be disposed at both lateral portions of the dimming zone column.

The dimming zone columns may be repeatedly arranged in a row direction, and thus wiring spaces disposed at both lateral portions of the dimming zone column or at an outermost portion of the circuit board may be uniformly used. Thus, even in a tile-type large-area module product, the same periodicity of the LED as that in a single product may be maintained, and uniform and enhanced light emitting properties may be provided.

In exemplary embodiments, the LED landing pads forming a dimming block or the dimming zone, the common wiring and the individual wiring may all be distributed at the same layer or at the same level on one surface of a substrate layer.

Accordingly, an increase of resistance due to a contact or via connection may be prevented, and improved electrical connection reliability may be achieved. Thus, desired high color reproducibility and high luminance may be effectively implemented from the dimming zone.

DETAILED DESCRIPTION OF THE EMBODIMENTS

According to exemplary embodiments of the present invention, a circuit board for a light-emitting diode assembly including light-emitting diode landing pads forming dimming zones and wirings connected to the dimming zones is provided. According to exemplary embodiments of the present invention, a backlight unit and an image display device including the circuit board for a light-emitting diode assembly are also provided.

In exemplary embodiments, the circuit board for the light-emitting diode assembly may be a glass-based circuit board for a mini-LED assembly.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
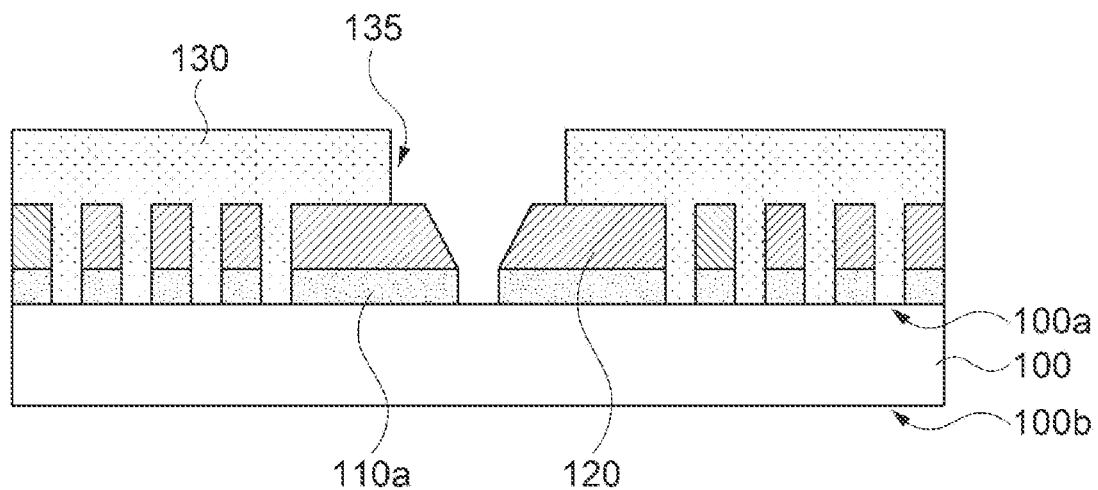
FIGS. 1 and 2 are schematic cross-sectional views illustrating a circuit board for a light-emitting diode assembly in accordance with exemplary embodiments.
Figure 2:
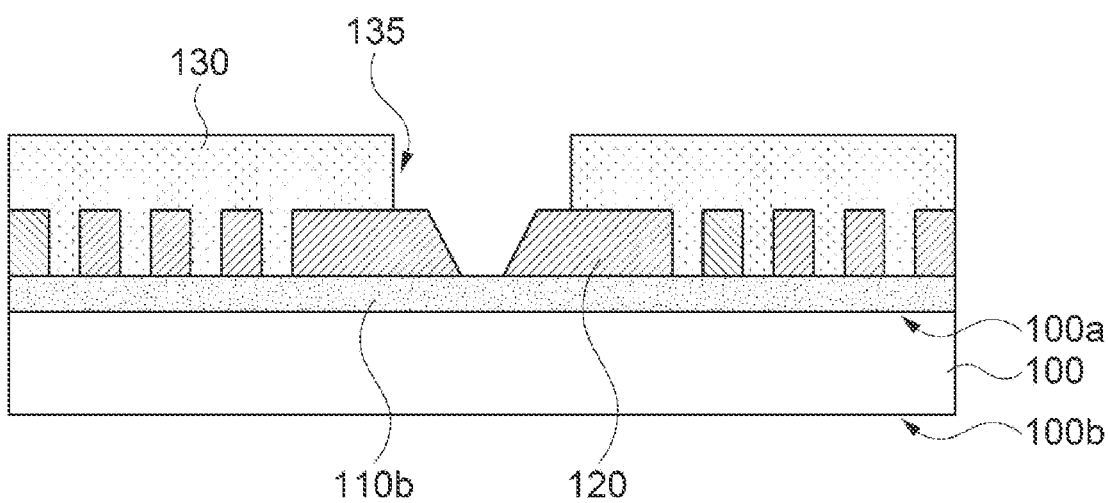

FIGS. 1 and 2 are schematic cross-sectional views illustrating a circuit board for a light-emitting diode assembly in accordance with exemplary embodiments.

Referring to FIGS. 1 and 2, a circuit board for a light-emitting diode assembly (hereinafter, may be abbreviated as a circuit board) may include a substrate layer 100 and a conductive circuit layer 120 formed on one surface of the substrate layer 100. An insulating layer 130 including an opening 135 provided as a landing hole may be formed on the substrate layer 100.

The substrate layer 100 may include an insulating material used as a base substrate or a core layer of a printed circuit board. For example, the substrate layer 100 may be an inorganic insulating substrate including a transparent inorganic material such as silicon oxide, silicon nitride, etc., or an organic substrate including a transparent polymer material such as polyimide, cyclic olefin polymer (COP), etc. Preferably, the substrate layer 100 may be a glass substrate.

The substrate layer 100 may include a first surface 100a and a second surface 100b. The first surface 100a and the second surface 100b may face each other. For example, the first surface 100a and the second surface 100b may correspond to a top surface and a bottom surface of the substrate layer 100, respectively.

The conductive circuit layer 120 may be formed on the first surface 100a of the substrate layer 100. In exemplary embodiments, the conductive circuit layer 120 may be formed only on the first surface 100a of the substrate layer 100, and may not be formed on the second surface 100b.

Accordingly, the circuit board according to the exemplary embodiments may be provided as a substantially single-sided circuit board.

In some embodiments, the conductive circuit layer 120 may be formed as a substantially single layer. For example, a multi-layered circuit structure through a via or a contact may be excluded.

The conductive circuit layer 120 may include a metal such as copper (Cu), nickel (Ni), palladium (Pd), chromium (Cr), etc.

An intermediate layer 110a and 110b may be formed between the conductive circuit layer 120 and the first surface 100a of the substrate layer 100.

As illustrated in FIG. 1, in some embodiments, the intermediate layer 110a may be a plating seed layer. In this case, the conductive circuit layer 120 may be a plated layer formed using the intermediate layer 110a as a seed.

For example, the intermediate layer 110a may include a metal such as titanium (Ti), copper (Cu), chromium (Cr), palladium (Pd), etc. The intermediate layer 110a may be formed by, e.g., an electroless plating or a deposition process.

In an embodiment, the intermediate layer 110a may include a copper seed layer, and the conductive circuit layer 120 may be a copper layer formed by an electrolytic plating using the copper seed layer.

The intermediate layer 110a and the conductive circuit layer 120 may be patterned substantially together to form circuit patterns.

As illustrated in FIG. 2, in some embodiments, the intermediate layer 110b may be an adhesive layer. In this case, the conductive circuit layer 120 may be formed from a metal foil, e.g., a copper foil. For example, the intermediate layer 110b and the conductive circuit layer 120 may be formed from a single-sided copper clad laminate (CCL) including the substrate layer 100. The intermediate layer 110b may be formed entirely on the first surface 100a of the substrate layer 100, and may be exposed between patterns of the conductive circuit layer 120.

In some embodiments, the intermediate layer 110a and 110b may be in direct contact with the first surface 100a of the substrate layer 100. The conductive circuit layer 120 may be in direct contact with the intermediate layer 110a and 110b.

The insulating layer 130 partially covering the conductive circuit layer 120 may be formed on the first surface 100a of the substrate layer 100. In exemplary embodiments, the insulating layer 130 may serve as a solder resist (SR) layer for mounting a light-emitting diode (LED).

In some embodiments, the insulating layer 130 may be formed of a highly reflective material having a light reflectance of 80% or more. For example, the insulating layer 130 may have a reflectance of 80% or more with respect to a visible light. In an embodiment, the insulating layer 130 may have a reflectance of 80% or more with respect to a D65 light source among CIE standard light sources.

Accordingly, an LED light reflected from an upper portion of the backlight unit including the circuit board and re-incident to the circuit board may be reflected again. Thus, light efficiency in the backlight unit and the image display device may be improved.

Figure 3:
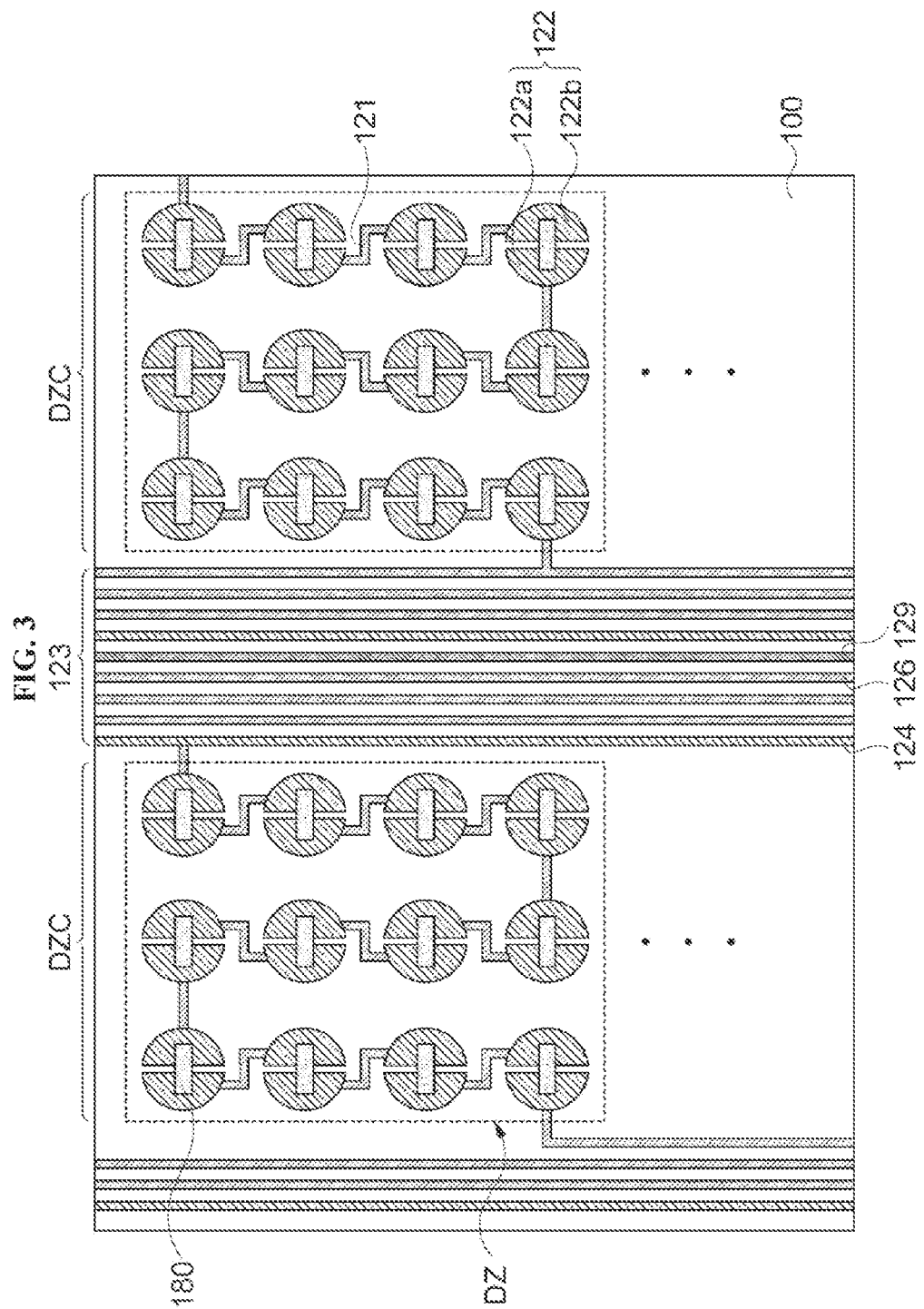
FIG. 3 is a schematic plan view illustrating a circuit board for a light-emitting diode assembly in accordance with exemplary embodiments.

The insulating layer 130 may include the opening 135 exposing the LED landing pad 122 (see FIG. 3). The LEDs may each be individually coupled or mounted on the LED landing pad 122 through the opening 135.

FIG. 3 is a schematic plan view illustrating a circuit board for a light-emitting diode assembly in accordance with exemplary embodiments.

Referring to FIG. 3, the conductive circuit layer 120 may include the LED landing pad 122, a common wiring 124 and an individual wiring 126. The conductive circuit layer 120 may further include a connection wiring 121 connecting the adjacent LED landing pads 122 to each other.

The LED landing pad 122 may include a first landing pad 122a and a second landing pad 122b having different polarities. For example, the first and second landing pads 122a and 122b may have a semicircular shape, and linear side surfaces of the first and second landing pads 122a and 122b may face each other.

Each of light-emitting diodes 180 may be mounted on the LED landing pad 122. The light-emitting diode 180 may be connected to and extend across the first and second landing pads 122a and 122b having different polarities.

As described with reference to FIGS. 1 and 2, the first and second landing pads 122a and 122b of the LED landing pad 122 may be partially exposed through the opening 135 of the insulating layer 130. Accordingly, the light-emitting diode 180 may be mounted on the circuit board through the opening 135.

The insulating layer 130 may entirely cover the common wiring 124, the individual wiring 126 and the connection wiring 121.

A predetermined number of the LED landing pads 122 may be connected by the connection wiring 121 to form a dimming zone DZ. For example, the first landing pad 122a and the second landing pad 122b included in different neighboring LED landing pads 122 may be connected to each other through the connection wiring 121.

The dimming zone DZ may serve as a light-emitting unit in a light-emitting diode assembly. For example, brightness and color of each of the dimming zones DZ may be individually controlled.

The number of the LED landing pads 122 included in one dimming zone DZ may be appropriately changed in consideration of a size of an image display device, a degree of integration of the light-emitting diodes, etc. For example, FIG. 3 illustrates that 12 LED landing pads 122 are included in one dimming zone DZ for convenience of descriptions. However, the number of LED landing pads 122 included in the dimming zone DZ may be further increased (e.g., 24, 36, 48, 72, etc.).

A plurality of the dimming zones DZ may be arranged on the first surface 100a of the substrate layer 100. The dimming zones DZ may be repeatedly disposed along a row direction and a column direction of the substrate layer 100 to form an assembly or an array.

In exemplary embodiments, wirings may be disposed between the dimming zones DZ adjacent in the row direction. As described above, the wirings may include the common wiring 124 and the individual wiring 126.

The common wiring 124 may be commonly connected to a predetermined number of dimming zones DZ among the dimming zones DZ. The individual wirings 126 may be independently connected to each of the dimming zones DZ.

For example, the common wiring 124 may be provided as a cathode wiring of the circuit board. The individual wiring 126 may be provided as an anode wiring of a circuit board.

In exemplary embodiments, a plurality of the dimming zones DZ may be arranged in the column direction to define a dimming zone column DZC. A plurality of the dimming zone columns DZCs may be arranged in the row direction. The wirings 124 and 126 may extend in the column direction between the dimming zone columns adjacent in the row direction.

As described above, the common wiring 124, the individual wiring 126 and the LED landing pads 122 may be included in the conductive circuit layer 120 together to form a single-layered circuit layer.

Accordingly, a channel resistance may be reduced compared to that of a circuit board having a multi-layered structure using a via or a contact. Further, the single-layered circuit layer may be used, so that all circuit patterns may be formed using a low-resistance copper foil or a low-resistance plating layer. Accordingly, the channel resistance may be further reduced.

Additionally, the wirings including the common wiring 124 and the individual wiring 126 may be disposed between the dimming zone columns, so that a regular or periodic arrangement and electrical connection of the LED or the LED landing pads 122 may be easily implemented. Thus, high luminous efficiency may be obtained and luminous properties may be controlled from the backlight unit including the circuit board with high reliability.

For example, a wiring bundle 123 including the common wiring 124 and the individual wiring 126 may be defined. A plurality of the wiring bundles 123 may be disposed in spaces between the dimming zone columns.

In an embodiment, one wiring bundle 123 may include a plurality of the individual wirings 126. In an embodiment, the wiring bundle 123 may include at least two or more common wirings 124. In an embodiment, the number of the individual wirings 126 included in one wiring bundle 123 may be greater than the number of common wirings 124. For example, as illustrated in FIG. 3, two common wiring 124 may be included in one wiring bundle 123.

In some embodiments, the wiring bundle 123 may further include a dummy electrode 129. Regions of wirings connected to different dimming zone columns DZC may be separated and partitioned from each other by the dummy electrode 129.

Figure 4:
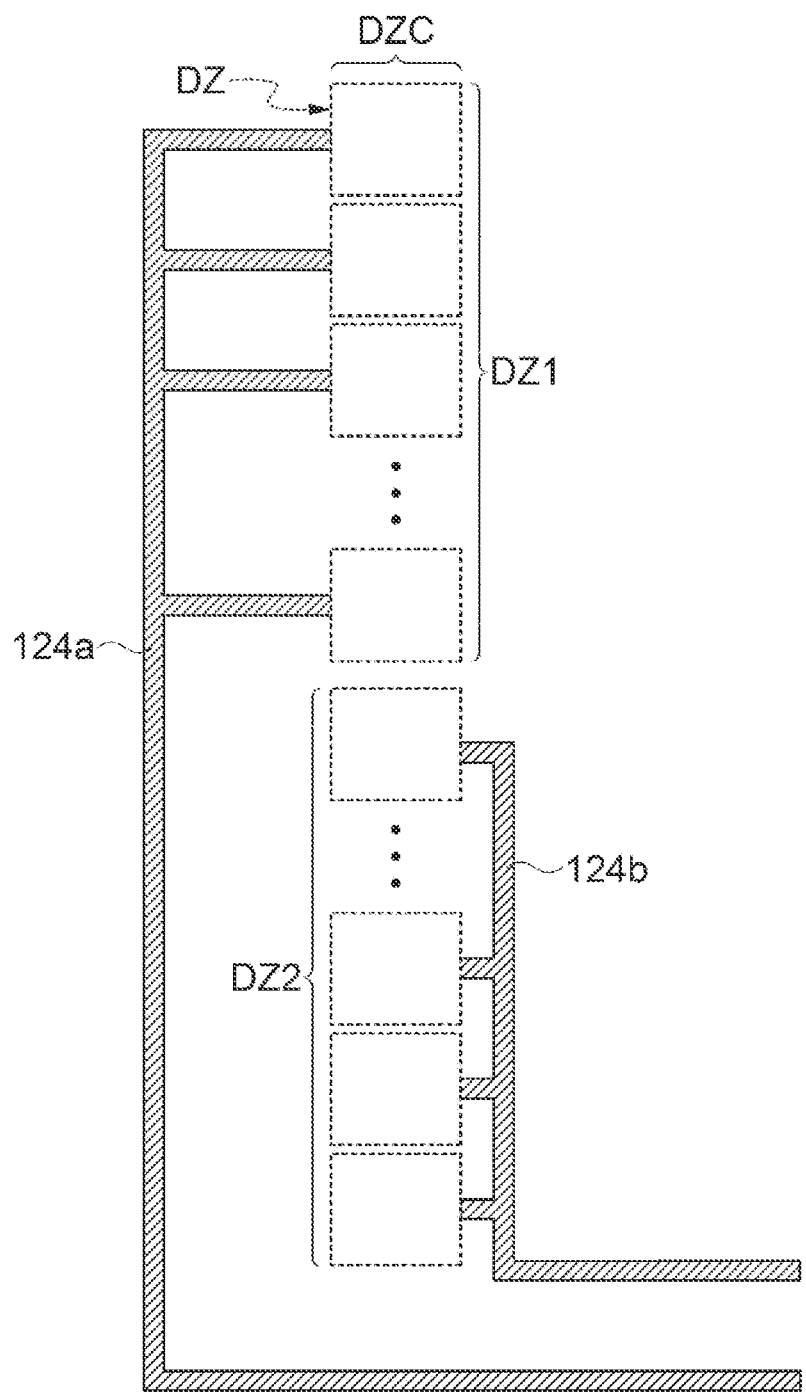
FIG. 4 is a schematic plan view illustrating a connection of a dimming zone column and a common wiring in accordance with exemplary embodiments.
Figure 5:
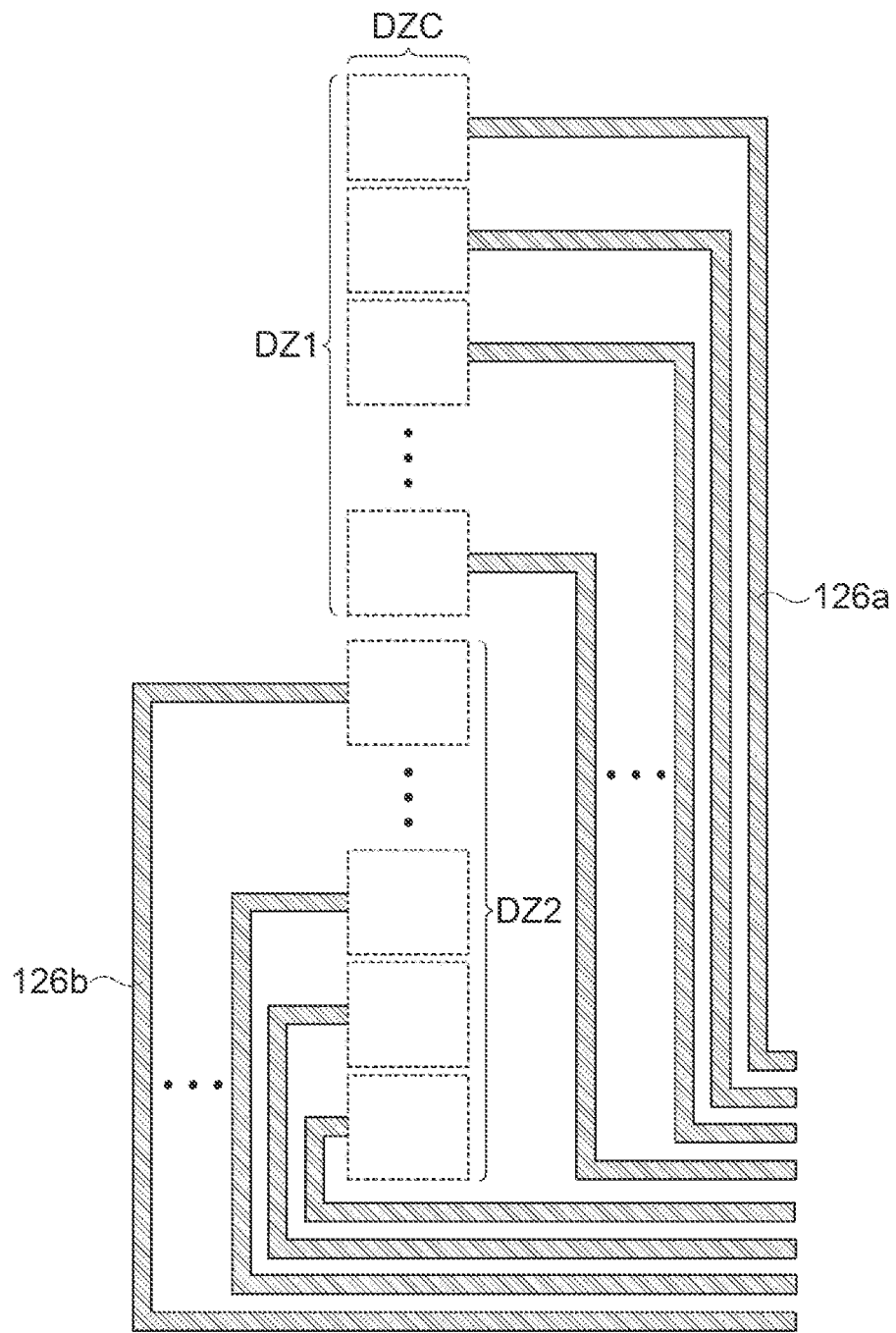
FIG. 5 is a schematic plan view illustrating a connection of a dimming zone column and an individual wiring in accordance with exemplary embodiments.
Figure 6:
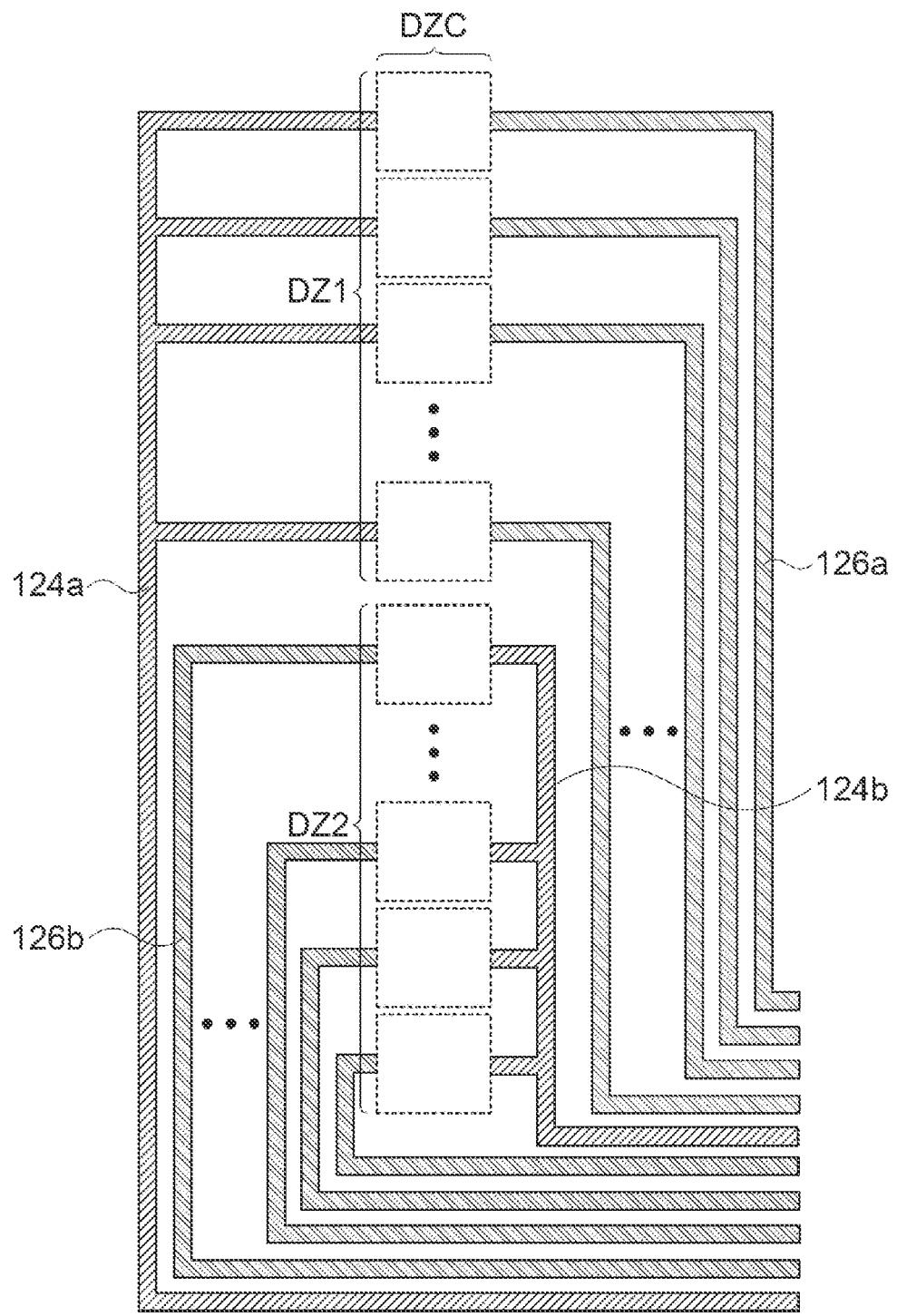
FIG. 6 is a schematic plan view illustrating connections of a dimming zone column and common wiring/individual wiring together in accordance with exemplary embodiments.

FIG. 4 is a schematic plan view illustrating a connection of a dimming zone column and a common wiring in accordance with exemplary embodiments. FIG. 5 is a schematic plan view illustrating a connection of a dimming zone column and an individual wiring in accordance with exemplary embodiments. FIG. 6 is a schematic plan view illustrating connections of a dimming zone column and common wiring/individual wiring together in accordance with exemplary embodiments.

For convenience of descriptions, illustration of the LED landing pads 122 and the connection wiring 121 included in each of the dimming zones DZ is omitted in FIGS. 4 to 6.

Referring to FIG. 4, as described above, a plurality of the dimming zones DZ may be arranged in the column direction to form the dimming zone column DZC.

The dimming zone column DZC may include a predetermined number of first dimming zones DZ1 disposed in an upper portion in a plan view of FIG. 4 and a predetermined number of second dimming zones DZ2 disposed in a lower portion in the plan view of FIG. 4

In an embodiment, the number of first dimming zones DZ1 and the number of second dimming zones DZ2 may be the same (e.g., in a case that an even number of the dimming zones DZ are included in the dimming zone column DZC). In an embodiment, a difference between the number of the first dimming zones DZ1 and the number of second dimming zones DZ2 may be 1 (e.g., in a case that an odd number of the dimming zones DZ are included in the dimming zone column DZC).

In exemplary embodiments, the common wiring 124 may include a first common wiring 124a and a second common wiring 124b. The first common wiring 124a and the second common wiring 124b may each be disposed at both lateral sides in the row direction of the dimming zone column DZC.

As illustrated in FIG. 4, the first common wiring 124a may be disposed at one lateral side (hereinafter, referred to as a first lateral side) of the dimming zone column DZC. The first common wiring 124a may be disposed at the first lateral side to extend in the column direction, and may be commonly connected to the first dimming zones DZ1. For example, a plurality of first connecting portions extending in the row direction may protrude from the first common wiring 124a to be electrically connected to the first dimming zones DZ1. For example, the first connecting portion may be connected to the LED landing pad 122 included in the first dimming zone DZ1.

The second common wiring 124b may be disposed on the other lateral side (hereinafter, referred to as a second side) of the dimming zone column DZC. The second common wiring 124b may be disposed at the second lateral side to extend in the column direction, and may be commonly connected to the second dimming zones DZ2. For example, a plurality of second connecting portions extending in the row direction may protrude from the second common wiring 124b to be electrically connected to the second dimming zones DZ2. For example, the second connecting portion may be connected to the LED landing pad 122 included in the second dimming zone DZ2.

Referring to FIG. 5, the individual wiring 126 may include first individual wirings 126a and second individual wirings 126b.

The first individual wirings 126a may be disposed at the second lateral side of the dimming zone column DZC. The first individual wirings 126a may be connected to each of the first dimming zones DZ1. For example, the first individual wirings 126a may extend in the column direction at the second lateral side, and a first individual connecting portion may protrude from each of the first individual wirings 126a in the row direction to be electrically connected to each of the first dimming zones DZ1. For example, the first individual connecting portion may be connected to the LED landing pad 122 included in the first dimming zone DZ1.

The second individual wirings 126*b* may be disposed at the first lateral side of the dimming zone column DZC. The second individual wirings 126*b* may be connected to each of the second dimming zones DZ2. For example, the second individual wirings 126*b* may extend in the column direction at the first side lateral, and a second individual connecting portion may protrude from each of the second individual wirings 126*b* in the row direction to be electrically connected to each of the second dimming zones DZ2. For example, the second individual connecting portion may be connected to the LED landing pad 122 included in the second dimming zone DZ1.

Referring to FIG. 6, the dimming zone column DZC, the common wiring 124 and the individual wiring 126 may be arranged together in a single layer as described with reference to FIGS. 1 to 3.

In exemplary embodiments, the first common wiring 124*a* and the second individual wirings 126*b* may be arranged together at the first lateral side of the dimming zone column DZC. Accordingly, a common connection to the first dimming zones DZ1 and an individual connection to the second dimming zones DZ2 may be implemented at the first lateral side.

The second common wiring 124*b* and first individual wirings 126*a* may be arranged together at the second lateral side of the dimming zone column DZC. Accordingly, a common connection to the second dimming zones DZ2 and an individual connection to the first dimming zones DZ1 may be implemented at the second lateral side.

According to the above-described exemplary embodiments, the upper and lower portions of the dimming zone column may be separated, and the common wiring connected to the upper portion and the common wiring connected to the lower portion may each be distributed at both lateral sides of the dimming zone column. Additionally, the individual wirings connected to the upper portion and the individual wirings connected to the lower portion may also each be disposed at both lateral sides of the dimming zone column.

Further, the upper common wiring and the lower individual wirings may be disposed together at the first lateral side, and the lower common wiring and the upper individual wirings may be disposed together at the second lateral side.

From the above-described wiring arrangement and connection structure, even though the number of the dimming zones DZ included in one dimming zone column DZC is increased, spatial efficiency of wirings may be improved to provide an LED assembly advantageous for a large-scaled area.

A plurality of the dimming zone columns DZC may be repeatedly arranged in the row direction. Accordingly, the arrangement construction of the common wiring 124 and the individual wirings 126 at the first lateral side and the second lateral side may be disposed together in a space between the adjacent dimming zone columns DZC.

Accordingly, a periodicity of the wirings 124 and 126 and the dimming zones DZ may be maintained in the entire circuit board, and the dimming zones DZ may be efficiently arranged with uniform periodicity even in a tile-type large-scaled backlight unit.

In some embodiments, an area occupied by the wirings in each of the first lateral side and the second lateral side may be substantially the same.

As illustrated in FIG. 3, the dummy electrode 129 may be disposed between the first lateral side and the lateral second side neighboring each other. In an embodiment, the dummy electrode 129 may not be disposed at an outermost lateral side of the circuit board. Accordingly, a wiring space or a wiring area may be easily designed.

In some embodiments, one first common wiring 124*a* and one second common wiring 124*b* may be disposed at the first lateral side and the second lateral side, respectively. In an embodiment, the number of the second individual wirings 126*b* disposed at the first lateral side and the number of the first individual wirings 126*a* disposed at the second lateral side may be the same (e.g., in the case that the even number of the dimming zones DZ are included in the dimming zone column DZC).

In an embodiment, a difference between the number of the second individual wirings 126*b* disposed at the first lateral side and the number of first individual wirings 126*a* disposed at the second lateral side may be 1 (e.g., in the case that the odd number of the dimming zones DZ are included in the dimming zone column DZC).

Figure 7:
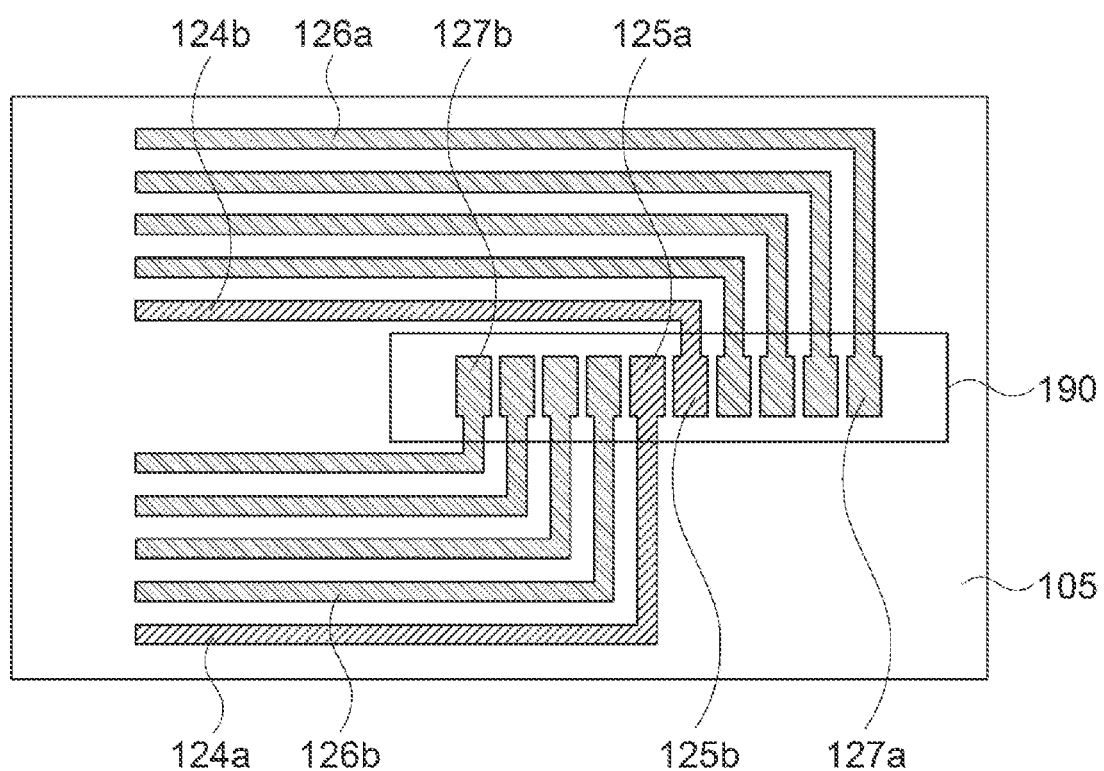
FIG. 7 is a schematic partially enlarged plan view illustrating connection pads included in a circuit board for a light-emitting diode assembly in accordance with exemplary embodiments.

FIG. 7 is a schematic partially enlarged plan view illustrating connection pads included in a circuit board for a light-emitting diode assembly in accordance with exemplary embodiments.

Referring to FIG. 7, one end portion of the substrate layer 100 may serve as an external connection region 105. For example, terminal end portions of the above-described wirings 124 and 126 may be assembled in the external connection region 105.

Connection pads may be connected to the terminal end portions of the wirings 124 and 126. A first common connection pad 125*a* and a second common connection pad 125*b* may be connected to terminal end portions of the first common wiring 124*a* and the second common wiring 124*b*, respectively. A first individual connection pad 127*a* and a second individual connection pad 127*b* may be connected to terminal end portions of the first individual wiring 126*a* and the second individual wiring 126*b*, respectively.

In an embodiment, the terminal end portions of the wirings 124 and 126 may serve as the connection pads 125 and 127.

Terminal end portions of the wirings 124*a*, 124*b*, 126*a* and 126*b* may be separated and connected to the connection pads 125*a*, 125*b*, 127*a*, and 127*b* in an upper region and a lower region in a plan view. Accordingly, spatial efficiency of the arrangement of the terminal end portions included in the wirings may be improved, and a resistance variation may be reduced.

An external circuit structure 190 may be electrically connected to the conductive circuit layer 120 through the external connection region 105. For example, the external circuit structure 190 may include a driving integrated circuit chip or an external power supply. The external connection region 105 may be provided as a bonding region for electrically connecting the external circuit structure 190 to the LED landing pads 122.

In an embodiment, the external circuit structure 190 may further include an intermediate circuit structure such as a flexible circuit board and a connector for connecting the circuit board and the driving integrated circuit.

The external circuit structure 190 may supply a common signal and an individual signal to the dimming zone DZ through the wirings 124 and 126 via the connection pads 125*a*, 125*b*, 127*a* and 127*b*.

According to the above-described exemplary embodiments, all wirings or conductive patterns included in the circuit board may be arranged on the first surface 100a of the substrate layer 100, and may substantially form a single-layered circuit.

For example, the above-described LED landing pads 122, the common wiring 124, the individual wiring 126 and the connection pads 125a, 125b, 127a and 127b may all be disposed at the same layer or at the same level.

Figure 8:
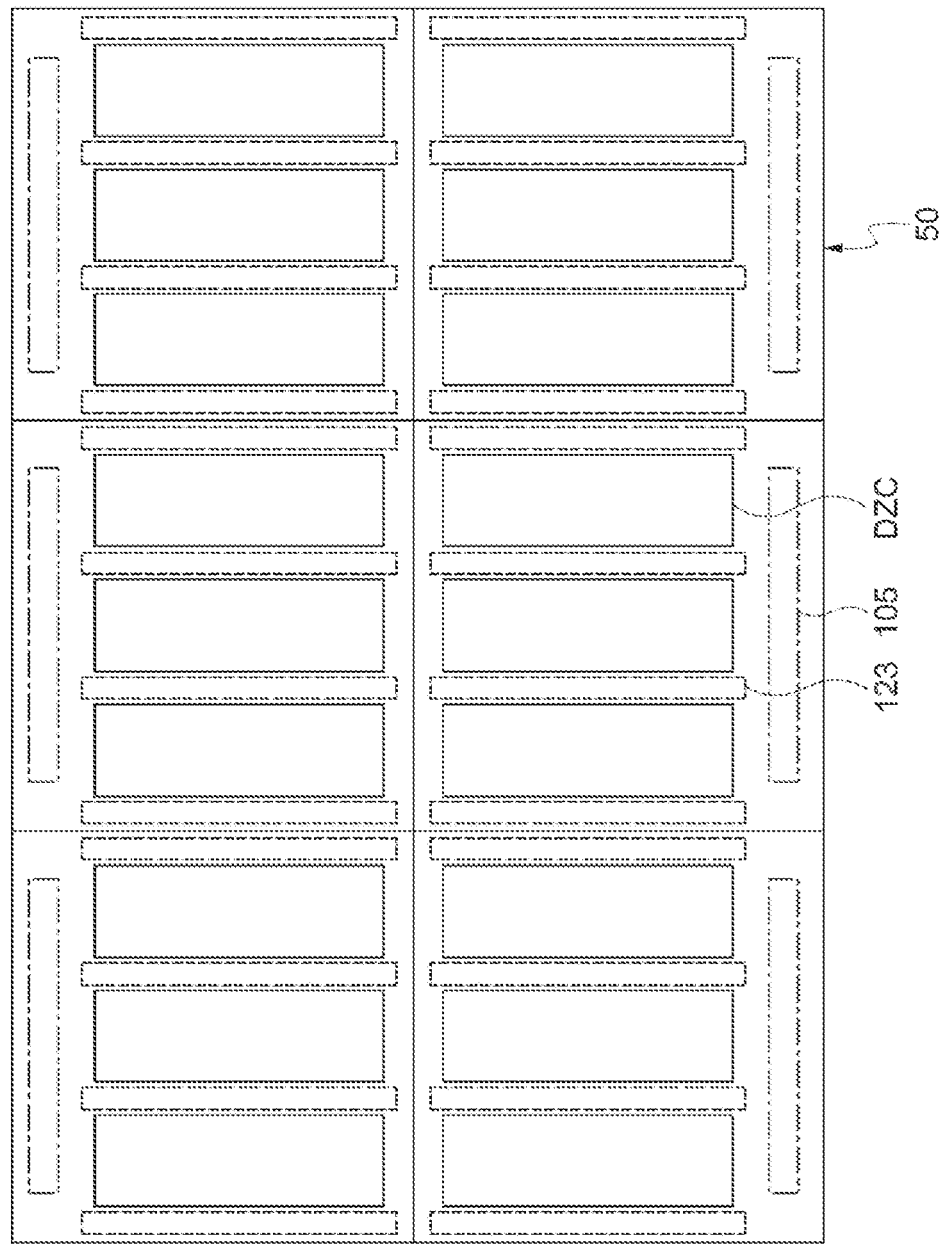
FIG. 8 is a schematic plan view illustrating a circuit board module for a light-emitting diode assembly in accordance with exemplary embodiments.

FIG. 8 is a schematic plan view illustrating a circuit board module for a light-emitting diode assembly in accordance with exemplary embodiments.

For convenience of descriptions, illustration of the detailed connection structure of the dimming zone column DZC, the wiring bundle 123 and the external connection region 105 described with reference to FIGS. 1 to 7 will be omitted.

Referring to FIG. 8, the circuit board module may be formed by assembling units having the above-described circuit board structure in a tile type. For example, the circuit board described with reference to FIGS. 1 to 7 may define one tile unit 50.

In exemplary embodiments, a plurality of tile units 50 may be repeatedly disposed along the row direction and the column direction to form a circuit board module.

The above-described connection construction of the dimming zone column (DZC) and the wirings 124 and 126 may be employed, so that periodicity of the LED arrangement may be maintained even when manufacturing a tile-type large-scaled circuit board module, and spatial efficiency of the wirings may be improved.

Figure 9:
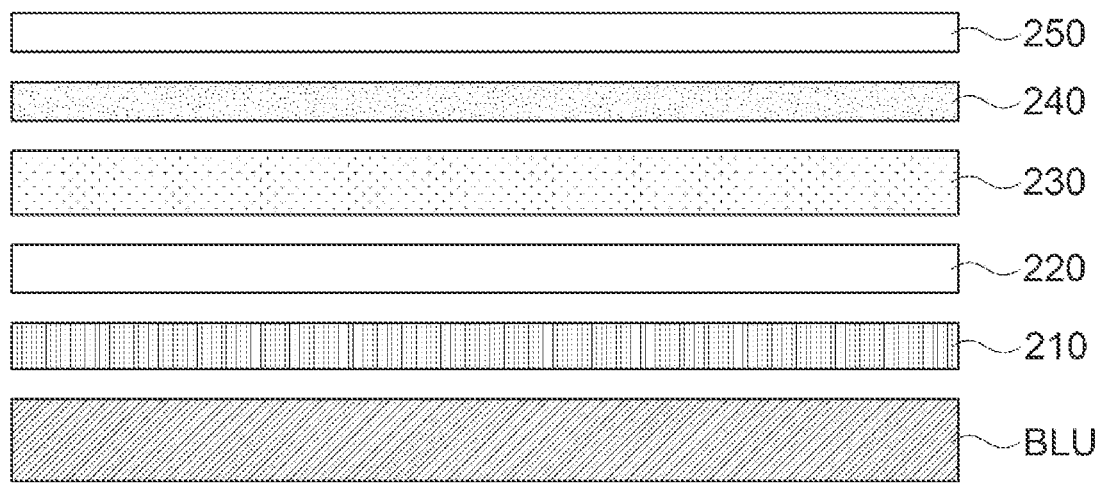
FIG. 9 is a schematic view illustrating a backlight unit and an image display device in accordance with exemplary embodiments.

FIG. 9 is a schematic view illustrating a backlight unit and an image display device in accordance with exemplary embodiments.

Referring to FIG. 9, as illustrated in FIG. 3, the light-emitting diodes 180 may be combined with the circuit board to define a backlight unit BLU. The backlight unit may be provided as a mini-LED BLU. In an embodiment, the backlight unit BLU may further include an optical film such as a light-guide plate or a diffusion plate.

The backlight unit BLU may be disposed under a TFT array substrate 220. A lower polarizing plate 210 may be disposed between the TFT array substrate 220 and the backlight unit BLU.

A liquid crystal cell 230 may be disposed on the TFT array substrate 220, and an LCD device to which a mini LED BLU according to exemplary embodiments is applied may be provided. A liquid crystal panel may be defined by the TFT array substrate 220 and the liquid crystal cell 230.

A color filter 240 may be disposed on the liquid crystal cell 230, and a cover glass 250 may be disposed on the color filter 240. An upper polarizing plate may be further disposed between the color filter 240 and the cover glass 250.

What is claimed is:

1. A circuit board for a light-emitting diode assembly, comprising:
    a substrate layer;
    a dimming zone column disposed on one surface of the substrate layer, the dimming zone column comprising dimming zones, each of the dimming zones comprising a predetermined number of LED landing pads, wherein the dimming zones comprise a predetermined number of first dimming zones included in an upper portion of the dimming zone column in a plan view and a predetermined number of second dimming zones included in a lower portion of the dimming zone column in the plan view;
    a first common wiring commonly connected to the first dimming zones and disposed at a first lateral side in a row direction of the dimming zone column;
    a second common wiring connected to the second dimming zones and disposed at a second lateral side in the row direction opposite to the first lateral side of the dimming zone column; and
    an individual wiring connected to each of the dimming zones,
    wherein the LED landing pads, the first common wiring, the second common wiring and the individual wiring are all disposed in a single-layered conductive layer.

2. The circuit board of claim 1, wherein the individual wiring comprises:
    first individual wirings disposed at the second lateral side of the dimming zone column; and
    second individual wirings disposed at the first lateral side of the dimming zone column.

3. The circuit board of claim 2, wherein the first individual wirings are each connected to the first dimming zones, and the second individual wirings are each connected to the second dimming zones.

4. The circuit board of claim 2, wherein the number of the first dimming zones and the number of the second dimming zones are the same, or a difference between the number of the first dimming zones and the number of the second dimming zones is 1.

5. The circuit board of claim 4, wherein the number of the second individual wirings disposed at the first lateral side and the number of the first individual wirings disposed at the second lateral side are the same, or a difference between the number of the second individual wirings disposed at the first lateral side and the number of the first individual wirings disposed at the second lateral side is 1.

6. The circuit board of claim 1, further comprising connection pads formed at each terminal end portion of the first common wiring, the second common wiring and the individual wiring.

7. The circuit board of claim 1, further comprising an insulating layer formed on the substrate layer to cover the first common wiring, the second common wiring and the individual wiring, the insulating layer comprising an opening partially exposing each of the LED landing pads.

8. The circuit board of claim 7, wherein a double-layered structure consisting of a single-layered conductive circuit layer including the LED landing pads, the first common wiring, the second common wiring and the individual wiring, and a single-layered insulating layer is stacked on the one surface of the substrate layer.

9. The circuit board of claim 8, further comprising an intermediate layer formed between the conductive circuit layer and the substrate layer.

10. The circuit board of claim 9, wherein the intermediate layer comprises a plating seed layer or an adhesive layer.

11. The circuit board of claim 1, wherein each of the LED landing pads comprises a first landing pad and a second landing pad which are physically separated from each other and have different polarities.

12. The circuit board of claim 11, wherein each of the dimming zones further comprises a connection wiring connecting the first landing pad and the second landing pad included in different neighboring LED landing pads to each other.

13. The circuit board of claim 1, wherein a plurality of the dimming zone columns are repeatedly arranged along a row direction.

14. The circuit board of claim 1, wherein the substrate layer comprises a glass substrate, an organic polymer substrate or an inorganic insulating substrate.

15. A circuit board module for a light-emitting diode assembly comprising the circuit board of claim 1,
wherein a plurality of the circuit boards for a light-emitting diode assembly are repeatedly arranged in a tile type along a row direction and a column direction.

16. A backlight unit, comprising:
the circuit board of claim 1; and
light emitting diodes mounted on the circuit board for a light-emitting diode assembly.

17. An image display device, comprising:
the backlight unit of claim 16; and
a liquid crystal panel disposed on the backlight unit.

18. A circuit board for a light-emitting diode assembly, comprising:
a substrate layer;
a dimming zone column disposed on one surface of the substrate layer, the dimming zone column comprising dimming zones, each of the dimming zones comprising a predetermined number of LED landing pads, wherein the dimming zones comprise a predetermined number of first dimming zones included in an upper portion of the dimming zone column in a plan view and a predetermined number of second dimming zones included in a lower portion of the dimming zone column in the plan view;
a first common wiring commonly connected to the first dimming zones and disposed at a first lateral side in a row direction of the dimming zone column;
a second common wiring connected to the second dimming zones and disposed at a second lateral side in the row direction opposite to the first lateral side of the dimming zone column; and
an individual wiring connected to each of the dimming zones
an insulating layer formed on the substrate layer to cover the first common wiring, the second common wiring and the individual wiring, the insulating layer comprising an opening partially exposing each of the LED landing pads.

\* \* \* \* \*